(12) United States Patent
Pan (10) Patent No.: US 11,917,929 B1
(45) Date of Patent: Feb. 27, 2024

(54) **EDGE *MAJORANA* QUASIPARTICLES AND QUBITS**

(71) Applicant: National Technology & Engineering Solutions of Sandia, LLC, Albuquerque, NM (US)

(72) Inventor: Wei Pan, San Ramon, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 77 days.

(21) Appl. No.: 17/548,890

(22) Filed: Dec. 13, 2021

(51) Int. Cl.
| | |
|---|---|
| *H10N 60/01* | (2023.01) |
| *G06N 10/40* | (2022.01) |
| *H10N 60/12* | (2023.01) |
| *H10N 60/80* | (2023.01) |
| *H10N 60/85* | (2023.01) |

(52) U.S. Cl.
CPC ......... *H10N 60/0912* (2023.02); *G06N 10/40* (2022.01); *H10N 60/12* (2023.02); *H10N 60/805* (2023.02); *H10N 60/855* (2023.02)

(58) Field of Classification Search
CPC .. H10N 60/0912; H10N 60/12; H10N 60/805; G06N 10/40
See application file for complete search history.

(56) References Cited

U.S. PATENT DOCUMENTS

| | | |
|---|---|---|
| 8,598,689 B2 | 12/2013 | Sandhu et al. |
| 9,489,634 B2 | 11/2016 | Bonderson |
| 10,692,010 B2 | 6/2020 | Freedman et al. |

OTHER PUBLICATIONS

Qing Lin He et al. ,Retracted: Chiral Majorana fermion modes in a quantum anomalous Hall insulator-superconductor structure. Science357,294-299(2017).DOI:10.1126/science.aag2792 retracted 2022 (Year: 2017).*
Zhang, H., Liu, CX., Gazibegovic, S. et al. Retracted Article: Quantized Majorana conductance. Nature 556, 74-79 (2018). https://doi.org/10.1038/nature26142 retracted 2021 (Year: 2018).*
Fu, et al., "Josephson current and noise at a superconductor/quantum-spin-Hall-insulator/superconductor junction", In Physical Review B, vol. 79, Issue 16, 161408(R), 2009, 4 Pages.

* cited by examiner

*Primary Examiner* — Matthew L Reames
(74) *Attorney, Agent, or Firm* — Samantha Updegraff; Calfee, Halter & Griswold LLP (57) ABSTRACT

Various embodiments described herein provide for a topological quantum computer that uses edge *Majorana* quasiparticles to form qubits. An inverted Indium Arsenide (InAs) and Gallium Antimonide (GaSb) heterostructure is disclosed that is a quantum spin Hall insulator. A layer of aluminum can be deposited over a nanotube that is placed across the layers of the heterostructure. Once the nanotube is removed, and a gate is formed on the heterostructure and the heterostructure is cooled so that the aluminum becomes superconducting, helical edge states are formed at the junction of the super conducting aluminum, the InAs, and the GaSb which creates a *Majorana* zero modes (MZMs) at zero magnetic field. The MZMs can be used to construct a topological qubit for fault-resistant topological quantum computation.

20 Claims, 6 Drawing Sheets

EDGE *MAJORANA* QUASIPARTICLES AND QUBITS

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Quantum computers are machines that use the properties of quantum physics to store data and perform computations. Classical computers, which include smartphones and laptops, encode information in binary "bits" that can either be 0s or 1s. In a quantum computer, the basic unit is a quantum bit or qubit. Traditional techniques of forming a qubit include confining ions or charged atomic particles in free space using electromagnetic fields. Qubits are stored in stable electronic states of each ion, and quantum information can be transferred through the collective quantized motion of the ions in a shared trap.

Other types of quantum computers have been suggested, including topological quantum computers that employ two-dimensional quasiparticles called anyons, or particles that employ non-Abelian statistics, whose world lines pass around one another to form braids in a three-dimensional spacetime (i.e., one temporal plus two spatial dimensions). These braids form the logic gates that make up the computation. Topological quantum computers using quantum braids are theoretically more stable than other quantum computing approaches, such as using trapped quantum particles, and require less error correction. Trapped quantum particles are prone to error as the quantum state suffers decoherence caused by heat, electrical noise, or vibration.

Nano-wires have been suggested as a platform for a topological quantum computer, but a large magnetic field is required for the platform to work. In other materials, such as type-II Indium Arsenide/Gallium Antimonide heterostructures, chemical etching is performed to create the device, which can lead to trivial edge states that cause interference with the qubit.

SUMMARY

The following is a brief summary of subject matter that is described in greater detail herein. This summary is not intended to be limiting as to the scope of the claims.

Various embodiments described herein provide for a topological quantum computer that uses edge *Majorana* quasi-particles to form qubits. An inverted Indium Arsenide (InAs) and Gallium Antimonide (GaSb) multilayer structure is disclosed that is a quantum spin Hall insulator. A layer of aluminum can be deposited over a nanotube that is placed across the layers of the multilayer structure. Once the nanotube is removed and a gate is formed on the multilayer structure and the multilayer structure is cooled so that the aluminum becomes superconducting, helical edge states are formed at the junction of the superconducting aluminum, the InAs, and the GaSb which creates a *Majorana* zero modes (MZMs) at zero magnetic field. The MZMs can be used to construct a topological qubit for fault-resistant topological quantum computation.

To that and related ends, a method is disclosed that comprises cleaving a multilayer structure to form a cleaved edge of the multilayer structure, wherein the multilayer structure comprises, in order from a first side to a second side of a multilayer structure, a substrate, a first layer of aluminum antimonide, a layer of indium arsenide, a layer of gallium antimonide, and a second layer of aluminum antimonide. The method also comprises placing a carbon nanotube across a width of the cleaved edge of the multilayer structure, wherein the carbon nanotube is placed across each layer of the multilayer structure. The method also comprises depositing a layer of aluminum on a surface of the cleaved edge of the multilayer structure. The method also comprises removing the carbon nanotube forming a gap in the layer of aluminum across the width of the cleaved edge. The method also comprises depositing a dielectric layer and metal layer on top of the second layer of aluminum antimonide. The method also comprises cooling the multilayer structure to a temperature at which the layer of aluminum transitions to a superconductor, wherein in response to the cooling, a pair of *Majorana* quasiparticles are formed, wherein a first quasiparticle is formed on a first side of the gap at a first junction of the layer of indium arsenide, the layer of gallium antimonide, and the layer of aluminum and a second quasiparticle is formed on a second side of the gap at a second junction of the layer of indium arsenide, the layer of gallium antimonide, and the layer of aluminum.

A quantum computer having at least one qubit is also provided, where the quantum computer comprises a multilayer structure having the following layers, in order from a first side to a second side, (1) a substrate, (2) a first layer of aluminum antimonide, (3) a layer of indium arsenide, (4) a layer of gallium antimonide, (5) a second layer of aluminum antimonide, (6) a layer of aluminum oxide, and (7) a metal gate layer. The quantum computer also includes a cleaved edge exposing a cross-section of each layer. The quantum computer also comprises a first portion and a second portion of a superconducting layer of aluminum formed on layers (1)-(5), wherein the first portion and the second portion are divided by a gap formed by removal of a carbon nanotube. The quantum computer also comprises a pair of *Majorana* zero modes formed at a junction of the first portion and second portions of the superconducting layer of aluminum and the layer of indium arsenide and the layer of gallium antimonide.

A device to facilitate formation of a topological qubit is also provided that includes a multilayer structure having the following layers, in order from a first side to a second side, (1) a substrate, (2) a first layer of aluminum antimonide, (3) a layer of indium arsenide, (4) a layer of gallium antimonide, (5) a second layer of aluminum antimonide, (6) a layer of aluminum oxide, and (7) a metal gate layer. The device also includes a cleaved edge exposing a cross-section of each layer. The device also includes a first portion and a second portion of a layer of aluminum formed on layers (1)-(5), wherein the first portion and the second portion are divided by a gap formed by removal of a carbon nanotube.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Various technologies pertaining to a topological quantum computer that uses edge *Majorana* quasi-particles and a method for manufacturing the topological quantum computer are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something and is not intended to indicate a preference.

The topological quantum computer disclosed herein is an improvement over classical quantum computers that, for example, use confined ions or charged atomic particles in free space using electromagnetic fields in that the topological quantum computer has significantly less decoherence which can lead to computational errors. In quantum computing, during a computation, if information about the qubit is revealed to an observer, the bit becomes a classical bit, and so significant effort is expended in isolating the qubits from their environment. Current proposals for doing that involve wiring up large numbers of "physical qubits" into a single "logical qubit" with the capacity for error correction. Some estimates suggest that hundreds or even thousands of physical qubits would be needed for each logical qubit.

Topological quantum computers made from *Majorana* quasiparticles can be made resistant to errors—that is, to decoherence, when the two halves at the ends of an electron chain are jumbled up so that the information encoded in each pair of end states can be kept perfectly hidden and can't inadvertently leak into the environment to cause decoherence. Because this jumbling weaves together the particle trajectories or their timeline "threads", this process is called braiding. Braiding ensures that the information in *Majorana* pairs is no longer localized on any of them but is made non-local, which protects it from incurring errors by the topological nature of the braiding.

Another improvement of the present disclosure is a technique to reduce the likelihood of there being trivial edge states at the junction of the superconducting aluminum, InAs, and GaSb layers due to etching related discontinuities. To achieve this improvement, instead of chemical etching or photolithography to remove a portion of a layer of aluminum to expose a gap on the cleaved edge of a multilayer structure, a carbon nanotube is placed across the multilayer structure, and then the aluminum layer is deposited around the carbon nanotube, and then the carbon nanotube is removed leaving a continuous edge which can facilitate the formation of helical edge states at the junction of the superconducting aluminum, InAs, and GaSb layers.

Figure 1:
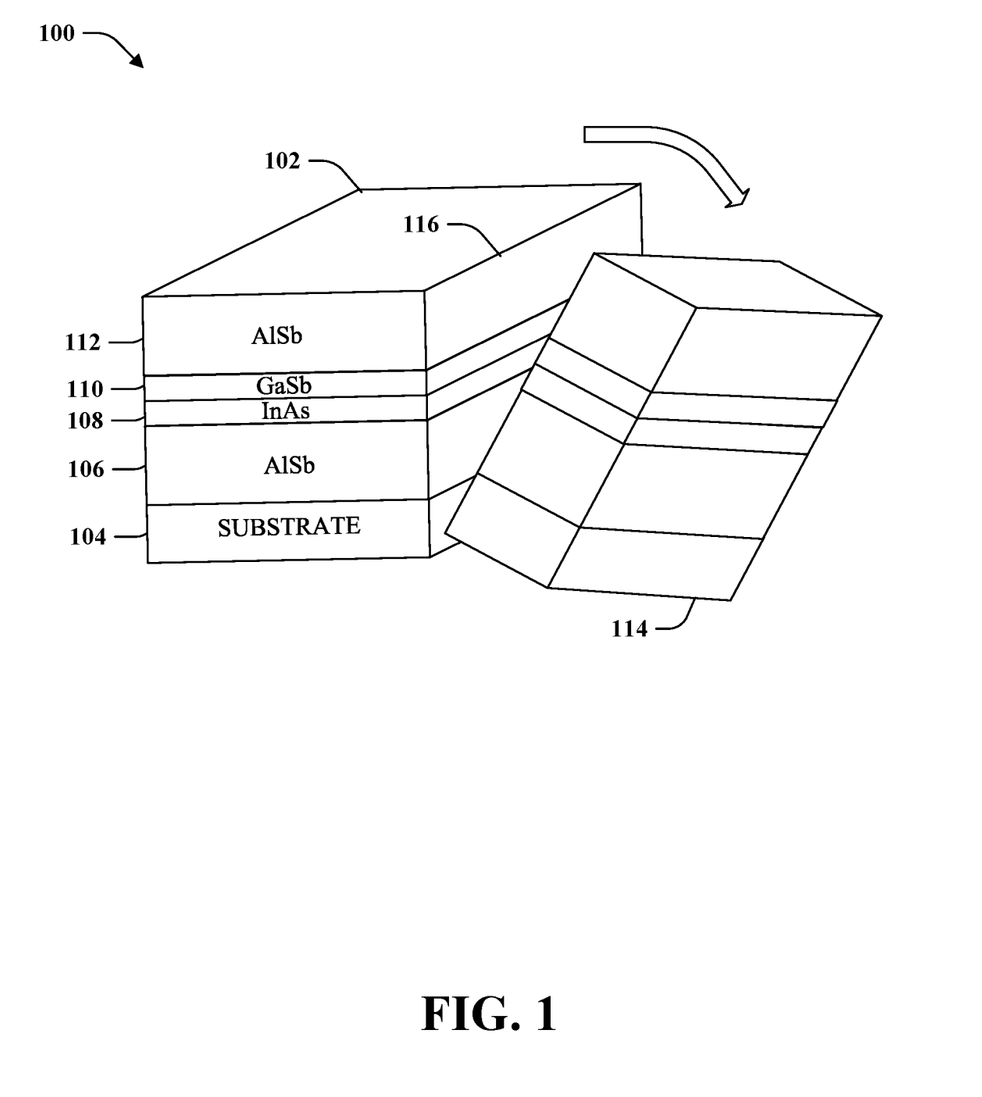
FIG. 1 is an exemplary embodiment of a multilayer structure with a cleaved edge.

Turning now to FIG. 1, illustrated is an exemplary embodiment of a multilayer structure 102 with a cleaved edge 116. The multilayer structure 102 can be formed from a number of layers of different materials. In an embodiment, the multilayer structure 102 can comprise a substrate 104, a first aluminum antimonide (AlSb) layer 106, an indium arsenide (InAs) layer 108, a gallium antimonide (GaSb) layer 110, and a second AlSb layer 112.

The multilayer structure can be a heterostructure which is a semiconductor structure in which the chemical composition changes with position. A heterostructure can comprise one or more heterojunctions where an interface within a semiconductor crystal across which the chemical composition changes. The thicknesses, relative and objective, of the layers can affect the properties of the heterojunctions. According to one or more embodiments of the present disclosure, the AlSb layers 106 and 112 can be between 20 nm and 100 nm. The thickness of the substrate can be between 100 nm and 300 nm. The thickness of GaSb layer 110 and InAs layer 108 can each be between 3 nm and 12 nm while the combined thickness of the GaSb layer 110 and InAs layer 108 is at least 10 nm which facilitates the formation of a quantum spin hall regime.

In an embodiment, the multilayer structure 102 can be cleaved to form a cleaved edge 116 by splitting the portion of the multilayer structure 114 from the multilayer structure 102. The cleaving can be performed in a vacuum or in an environment with an inert gas (e.g., nitrogen, neon, argon, etc.) to prevent oxidation or other impurities from forming on the cleaved edge 116. In an embodiment, a linear or curved scratch or etching can be formed on a surface of the multilayer structure 102 (e.g., on the substrate 104), by a scriber tip or indenter tip or by a laser etching, and then mechanical pressure can be applied to the multilayer structure 102 on one or both sides of the etched line until the multilayer structure 102 cleaves forming the cleaved edge 116, and cleaved portion of the multilayer structure 114.

Figure 2:
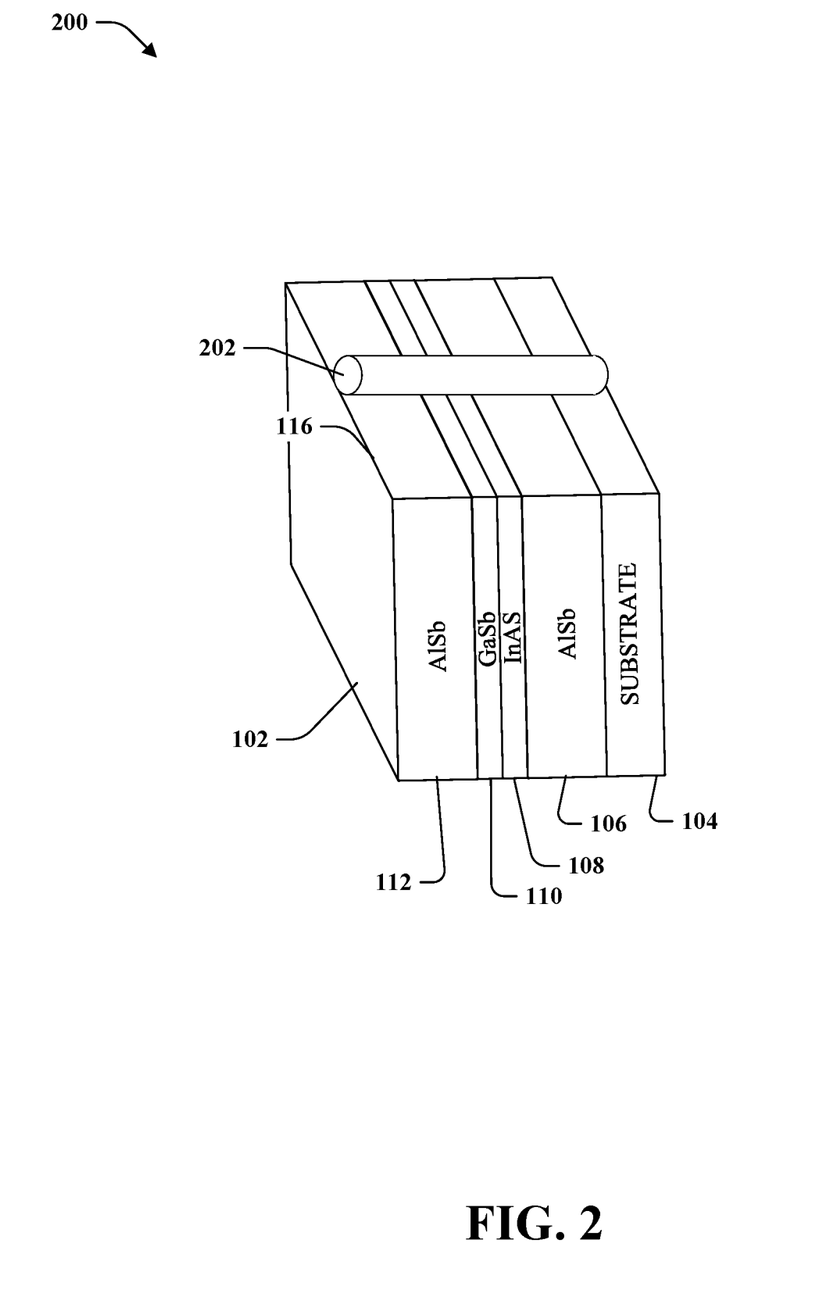
FIG. 2 is an exemplary embodiment of a nanotube placed across the multilayer structure.

Turning now to FIG. 2, illustrated is an exemplary embodiment of a carbon nanotube 202 placed across the multilayer structure 102. The carbon nanotube 202 can be placed across the cleaved edge 116 of the multilayer structure 102 such that the nanotube covers each of AlSb layer 112, GaSb layer 110, InAs layer 108, AlSb layer 106 and at least a portion of the substrate 104. In an embodiment, the carbon nanotube 102 is at least 110 nm long to cover the layers 112, 110, 108, 106 and at least a portion of the substrate 104.

In at least some embodiments of the present disclosure, the carbon nanotube 202 can be a single-wall carbon nanotube that can be a cutout of a two-dimensional hexagonal lattice of carbon atoms rolled up along one of the Bravais lattice vectors of the hexagonal lattice to form a hollow cylinder. In other embodiments, the carbon nanotube 202 can be a multi-wall carbon nanotube comprising nested single-wall carbon nanotubes weakly bound together by van der Waals interactions in a tree ring-like structure.

In an embodiment, the carbon nanotube 202 can be placed on the cleaved edge 116 by a nanomanipulator that can be a specialized nanorobot and microscopic viewing system for working with objects on an extremely small scale. The nanomanipulator can include an optical scanning device, a computer interface and one or more physical manipulators that can place or maneuver the carbon nanotube 202 across the cleaved edge 116 of the multilayer structure 102.

Figure 3:
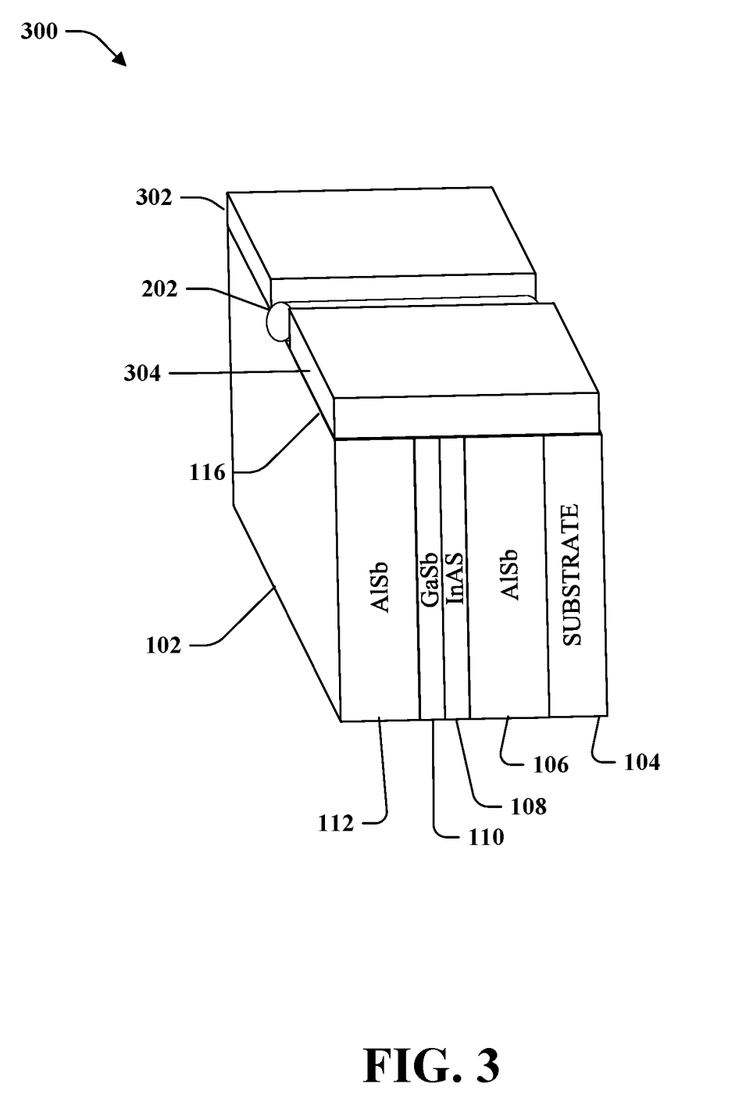
FIG. 3 is an exemplary embodiment showing aluminum deposited over the multilayer structure.

Turning now to FIG. 3, illustrated is an exemplary embodiment showing aluminum layers 302 and 304 deposited over the cleaved edge 116 of the multilayer structure 102.

In an embodiment, the aluminum layers 302 and 304 can be deposited separately around the carbon nanotube 202, and in other embodiments, the aluminum layers 302 and 304 can form a contiguous layer over and/or around the carbon nanotube 202. Each of aluminum layers 302 and 304 can cover each of AlSb layer 112, GaSb layer 110, InAs layer 108, AlSb layer 106 and at least a portion of the substrate 104 on each side of the carbon nanotube 202. The aluminum layers 302 and 304 can be applied and/or deposited via a sputter deposition or a thermal evaporator process. The thickness of the aluminum layers 302 and 304 can be between 100 and 300 nm. The aluminum layers 302 and 304 can be deposited at any of a range of temperatures and do not have to be deposited at a temperature at which the aluminum is superconducting.

Sputter deposition is a physical vapor deposition method of thin-film deposition using sputtering where material is ejected from a "target", which is the source of the material and deposited onto a surface. Electrical and magnetic fields can be used to confine the charged plasma particles close to the surface of the sputter target. In a magnetic field, electrons can follow helical paths around magnetic field lines, undergoing more ionizing collisions with gaseous neutrals near the target surface than would otherwise occur (as the target material is depleted, a "racetrack" erosion profile may appear on the surface of the target.) The sputter gas is typically an inert gas such as argon. The extra argon ions created as a result of these collisions lead to a higher deposition rate. The plasma can also be sustained at a lower pressure this way which reduces the likelihood of the aluminum to form aluminum oxide.

In other embodiments, the aluminum layers 302 and 304 can be applied via a thermal evaporation process where the source aluminum evaporates in a vacuum due to high temperature heating, which facilitates the vapor particles moving and directly reaching the surface of the cleaved edge 116 where these vapors again change to a solid state.

Figure 4:
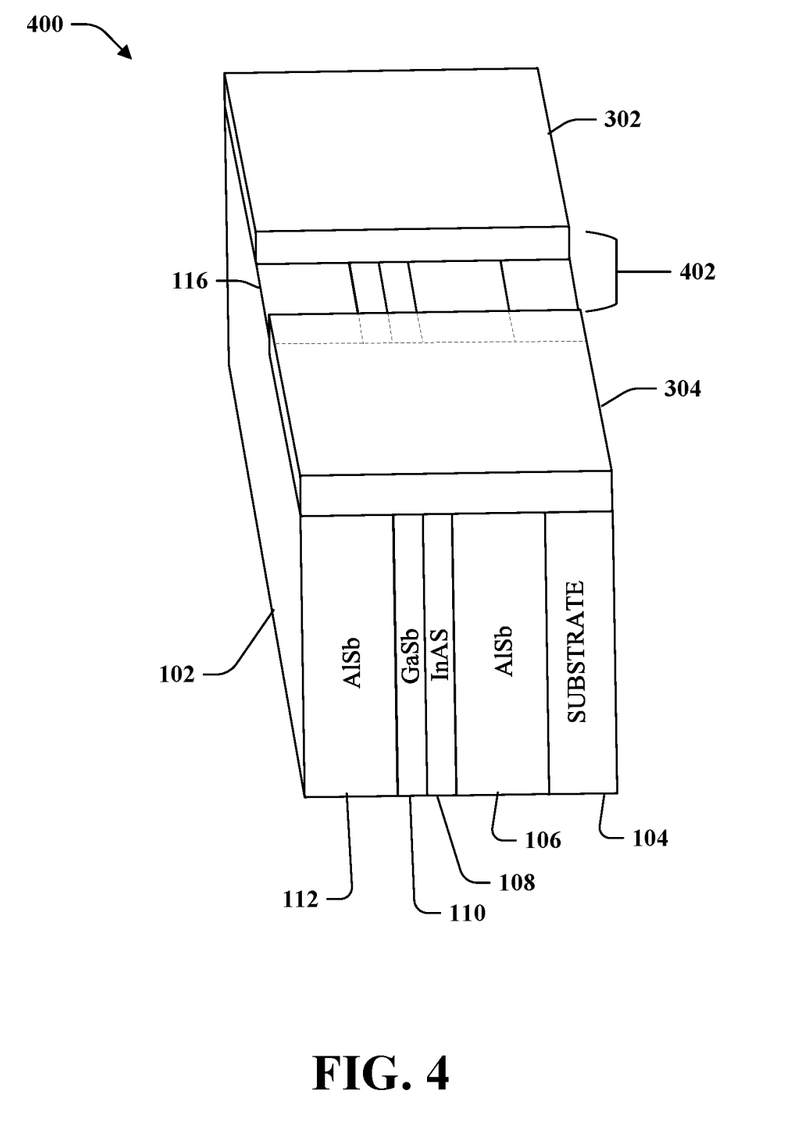
FIG. 4 is an exemplary embodiment showing the multilayer structure after the removal of the nanotube.

Turning now to FIG. 4, illustrated is an exemplary embodiment showing the multilayer structure 102 after the removal of the carbon nanotube 202. The carbon nanotube 202 can be removed by the nanomanipulator after the aluminum layers 302 and 304 are deposited over the surface of the cleaved edge 116. After the carbon nanotube 202 is removed, a gap 402 can be left behind where the aluminum was not deposited. The gap 402 can be between 100 nm and 1000 nm.

By forming the gap 402 via removal of the carbon nanotube 202 and not via etching a gap in the aluminum layers 302 and 304, a continuous edge can be formed along the length of the junction between the aluminum layers 302 and 304 and the layers of AlSb layer 112, GaSb layer 110, InAs layer 108, AlSb layer 106, and substrate 104. The continuous clean edge can enable a helical edge state to form at the junction of the aluminum layers 302 and 304 and the GaSb layer 110 and InAs layer 108 without being masked by trivial edge states due to discontinuities or roughness in the surfaces.

In various embodiments of the present disclosure, the gap 402 can be formed via traditional etching techniques instead of being formed through the placement and removal of the carbon nanotube 202. More specifically, the layer of aluminum 302 and 304 can be sputtered or otherwise deposited upon the cleaved edge 116 of the multilayer structure 102. Thereafter, a strip can be etched from the aluminum, thereby forming the gap 402. It is to be understood that this approach may lead to structural irregularities over the exposed surface of the multilayered structure in the gap, where such irregularities are caused by imperfect etching.

Figure 5:
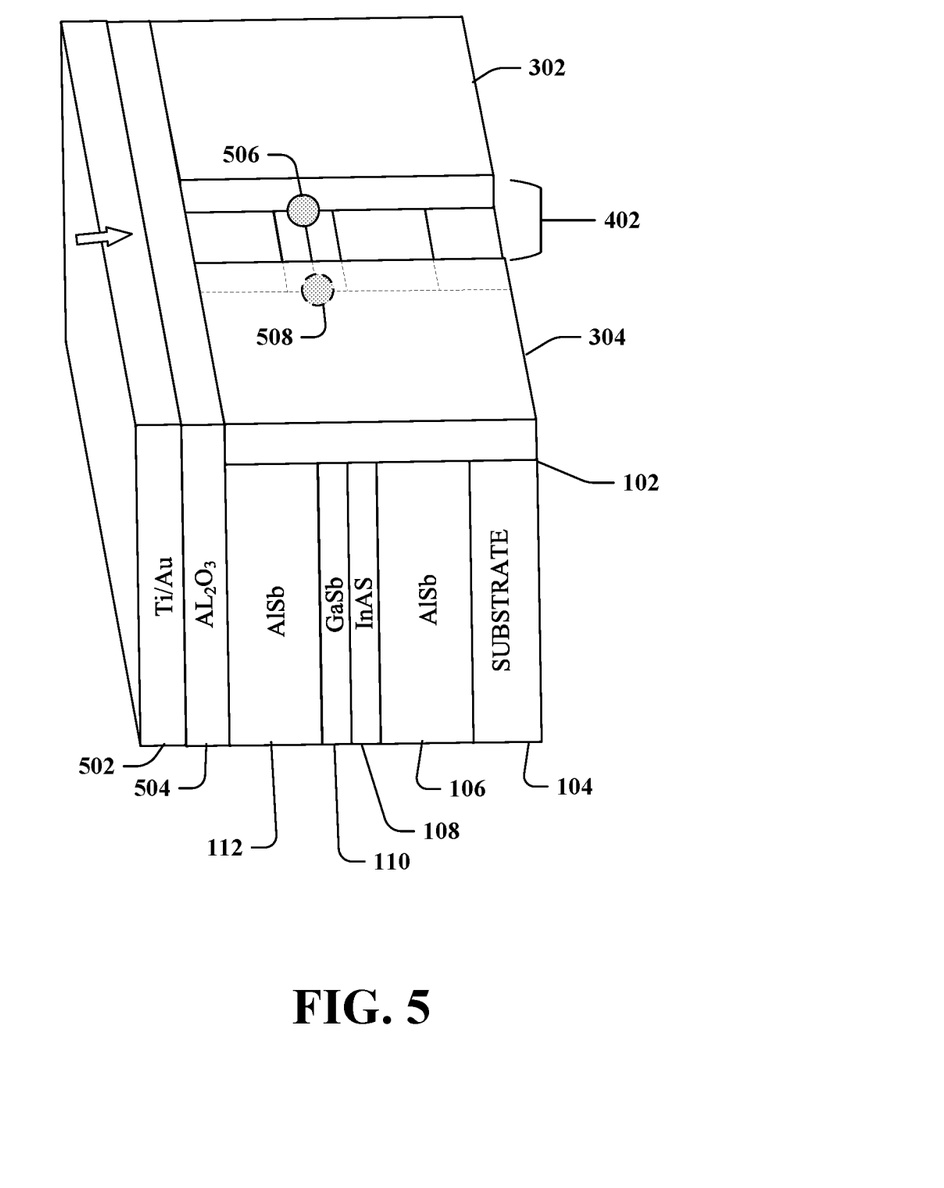
FIG. 5 is an exemplary embodiment showing formation of a gate and *Majorana* zero modes.

Turning now to FIG. 5, illustrated is an exemplary embodiment showing formation of a gate layer 502 and *Majorana* zero modes 506 and 508 to facilitate formation of a topological qubit. After the gap 402 is formed, a dielectric layer 504 can be formed on the multilayer structure 102 over AlSb layer 112. The dielectric layer 504 can be any dielectric that can provide an electrically clean interface to the multilayer structure, high capacitance or thickness to avoid dielectric breakdown and leakage by quantum tunneling. In at least one embodiment, the dielectric layer 504 can be aluminum oxide ($Al_2O_3$).

After the dielectric layer 504 is deposited, a gate layer 502 can be deposited. The gate layer 502 can initially comprise a layer of titanium (Ti) that is deposited first as an adhesion layer, and then a second layer of gold (Au) can be deposited over the titanium layer. The adhesion layer of titanium in the gate layer 502 can facilitate adhesion of the gold layer to the multilayer structure 102. Specifically, the titanium adhesion layer can bond with the aluminum oxide while also providing a substrate for the gold to attach and/or form an alloy after heating. The adhesion layer can be between 5-10 nm in some embodiments, and a thin layer such as this is not likely to alter the properties of the gold layer.

The gate layer 502 can be Fermi level tuned to turn the assembly into a quantum spin Hall insulator by doping the gate layer 502 with either n or p doping to either add or remove charge carriers from the material of the gate layer 502 which can change the electrical and physical properties of the gate layer 502.

The multilayer structure 102 and the layers deposited thereon can be cooled to a temperature at which the aluminum layers 302 and 304 become superconducting, and the regions at the junction of the GaSb layer 110, and InAs layer 108 and aluminum layers 302 and 304 can form *Majorana* zero modes 506 and 508 (MZMs) which are non-Abelian anyons. Non-Abelian anyons can be interchanged which changes the state of a system in a way that depends on the order in which the exchange was performed. MZMs can be *Majorana* fermions. Because the MZMs adhere to non-Abelian statistics, a particle loop that encircles another particle in two dimensions cannot be deformed to a point without cutting through the other particle. Consequently, the notion of a winding of one particle around another in two dimensions is well-defined. Then, when two particles are interchanged twice in a clockwise manner, their trajectory involves a non-trivial winding, and the system does not come back to the same state.

After the MZMs 506 and 508 are created at the junction of the helical edge state formed along the superconducting aluminum layers 302 and 304 and the InAs layer 108 and GaSb layer 110 junction, the assembly can be tested via the Josephson effect to determine whether a *Majorana* quasiparticle has formed. The Josephson effect is a phenomenon that occurs when two superconductors are placed in proximity, a current, known as a supercurrent, that flows continuously without any voltage applied, across a device known as a Josephson junction (JJ). Normally, without an MZM, the periodicity of the current follows a $2\pi$ relationship, but in the presence of an MZM, the Josephson effect exhibits a $4\pi$ periodicity.

The MZMs 506 and 508 can be braided with another pair of MZMs associated with another multilayer structure. The braiding motion, rotating or moving the MZMs 506 and 508 with respect to the other pair of MZMs can form a topological qubit that can be exploited for quantum computation.

Figure 6:
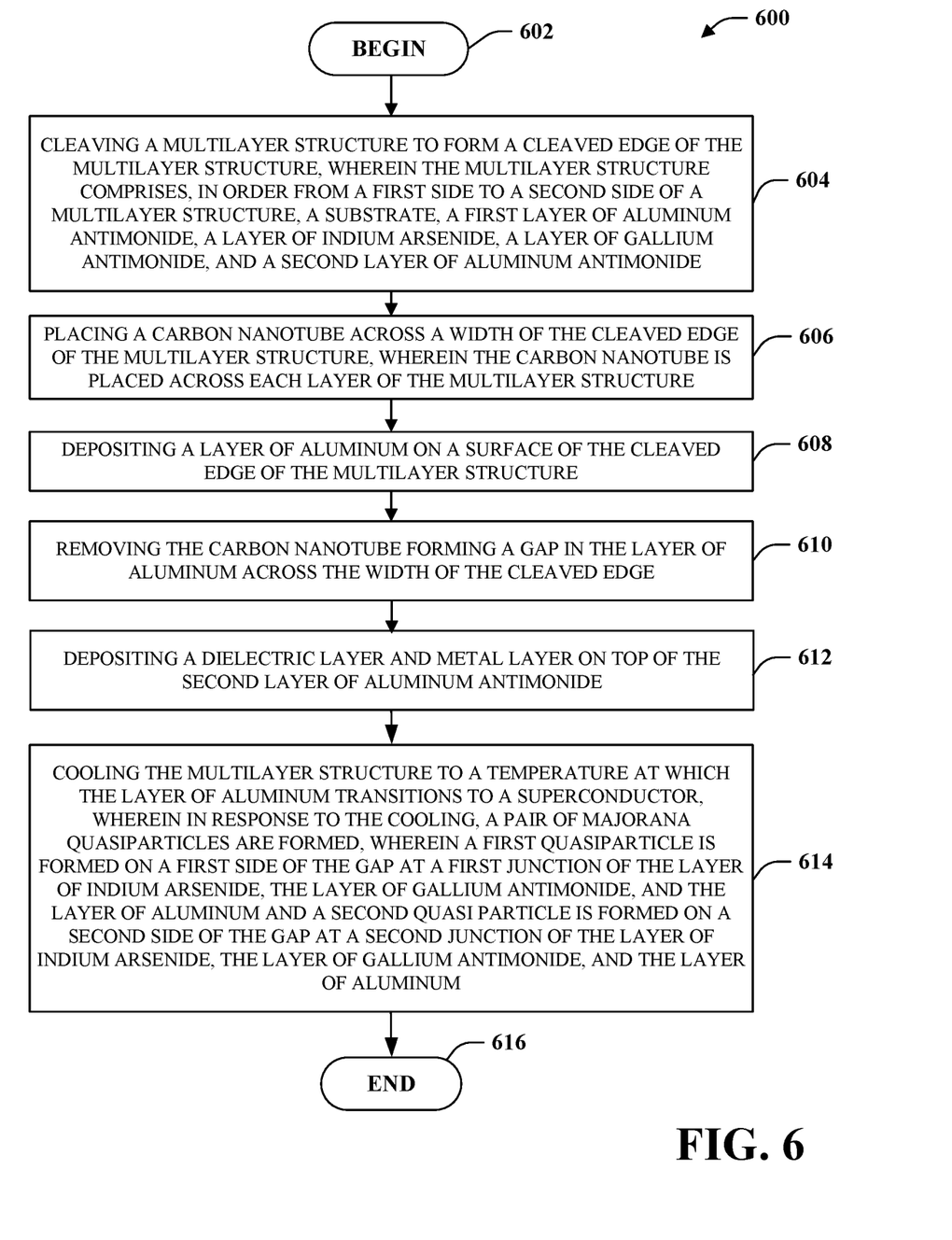
FIG. 6 is flow diagram that illustrates an exemplary methodology for forming a topological quantum computer.

FIG. 6 illustrates an exemplary methodology 600 relating to forming a topological quantum computer. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

The methodology 600 begins at 602, and at 604, the method can include the step of cleaving a multilayer structure to form a cleaved edge of the multilayer structure, wherein the multilayer structure comprises, in order from a first side to a second side of a multilayer structure, a substrate, a first layer of aluminum antimonide, a layer of indium arsenide, a layer of gallium antimonide, and a second layer of aluminum antimonide.

At 606, the method can include the step of placing a carbon nanotube across a width of the cleaved edge of the multilayer structure, wherein the carbon nanotube is placed across at least a portion of each layer of the multilayer structure.

At 608, the method can include the step of depositing a layer of aluminum on a surface of the cleaved edge of the multilayer structure.

At 610, the method can include the step of removing the carbon nanotube forming a gap in the layer of aluminum across the width of the cleaved edge.

At 612, the method can include the step of depositing a dielectric layer and metal layer on top of the second layer of aluminum antimonide.

At 614, the method can include the step of cooling the multilayer structure to a temperature at which the layer of aluminum transitions to a superconductor, wherein in response to the cooling, a pair of *Majorana* quasiparticles are formed, wherein a first quasiparticle is formed on a first side of the gap at a first junction of the layer of indium arsenide, the layer of gallium antimonide, and the layer of aluminum and a second quasi particle is formed on a second side of the gap at a second junction of the layer of indium arsenide, the layer of gallium antimonide, and the layer of aluminum.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method, comprising:
    providing a multilayer structure, wherein the multilayer structure comprises a top, a bottom that is opposite the top, and a side that extends from the bottom to the top of the multilayer structure, and further wherein the multilayer structure comprises, in order and from the bottom to the top of the multilayer structure:
    a substrate;
    a first layer of aluminum antimonide;
    a layer of indium arsenide;
    a layer of gallium antimonide;
    a second layer of aluminum antimonide;
    placing a carbon nanotube along the side of the multilayer structure in a direction that extends between the bottom and the top of the multilayer structure, wherein the carbon nanotube is placed across at least a portion of the substrate, the first layer of aluminum antimonide, the layer of indium arsenide, the layer of gallium antimonide, and the second layer of aluminum antimonide;
    depositing a layer of aluminum on the side of the multilayer structure such that the multilayer structure includes the layer of aluminum;
    removing the carbon nanotube such that a gap is formed in the layer of aluminum along the side of the multilayer structure; and
    depositing a dielectric layer and metal layer on top of the second layer of aluminum antimonide such that the multilayer structure further comprises the dielectric layer and the metal layer.

2. The method of claim 1, further comprising
    forming a helical edge state across a boundary between the layer of indium arsenide and the layer of gallium antimonide.

3. The method of claim 1, further comprising:
    doping the metal layer to transition the multilayer structure into a quantum spin hall insulator.

4. The method of claim 1,
    where thickness of the first layer of aluminum antimonide is between 20 nm and 100 nm.

5. The method of claim 4,
    where thickness of the second layer of aluminum antimonide is between 20 nm and 100 nm.

6. The method of claim 1,
    where thickness of the substrate is between 100 nm and 300 nm.

7. The method of claim 1, where:
thickness of the layer of gallium antimonide is between 3 nm and 12 nm; and
thickness of the layer of indium arsenide is between 3 nm and 12 nm.

8. The method of claim 1, wherein the metal layer comprises a titanium adhesion layer proximate to the dielectric layer and a gold layer proximate to the titanium adhesion layer.

9. A quantum computer, comprising:
a multilayer structure comprising:
a substrate;
a first layer of aluminum antimonide that is layered on the substrate;
a layer of indium arsenide that is layered on the first layer of aluminum antimonide, such that the first layer of aluminum antimonide is positioned between the substrate and the layer of indium arsenide;
a layer of gallium antimonide that is layered on the first lay of aluminum antimonide, such that the layer of indium arsenide is positioned between the first layer of aluminum antimonide and the layer of gallium antimonide;
a second layer of aluminum antimonide that is layered on the layer of gallium antimonide, such that the layer of gallium antimonide is positioned between the layer of indium arsenide and the second layer of aluminum antimonide;
a layer of aluminum oxide that is layered on the second layer of aluminum antimonide, such that the second layer of aluminum antimonide is positioned between the layer of gallium antimonide and the layer of aluminum oxide; and
a metal gate layer that is layered on the layer of aluminum oxide, such that the layer of aluminum oxide is positioned between the second layer of aluminum antimonide and the metal gate layer; and
a superconducting layer of aluminum across the substrate, the first layer of aluminum antimonide, the layer of indium arsenide, the layer of gallium antimonide, and the second layer of aluminum antimonide, where the superconducting layer of aluminum includes a first portion and a second portion, the first portion and the second portion are divided by a gap, and further where portions of the substrate, the first layer of aluminum antimonide, the layer of indium arsenide, the layer of gallium antimonide, and the second layer of aluminum antimonide are exposed in the gap.

10. The quantum computer of claim 9, wherein the metal gate layer is tuned to cause the quantum computer to form a quantum spin Hall insulator.

11. The quantum computer of claim 9, wherein the metal gate layer comprises at least one of titanium or gold.

12. The quantum computer of claim 9, wherein a combined thickness of the layer of indium arsenide and the layer of gallium antimonide is at least 10 nm.

13. The quantum computer of claim 9, wherein the gap that separates the first portion and the second portion is between 100 nm and 1000 nm.

14. The quantum computer of claim 9, wherein the first layer of aluminum antimonide and the second layer of aluminum antimonide are each between 20 nm and 100 nm.

15. The quantum computer of claim 9, further comprising a second multilayer structure that is equivalent to the multilayer structure, where the gap of the multilayer structure faces a gap of the second multilayer structure.

16. A device to facilitate formation of a topological qubit, comprising:
a multilayer structure having a bottom, a top that is opposite the bottom, and a side that extends between the bottom and the top of the multilayer structure, where the multilayer structure comprises the following layers, in order the top to the bottom:
a substrate;
a first layer of aluminum antimonide;
a layer of indium arsenide;
a layer of gallium antimonide;
a second layer of aluminum antimonide;
a layer of aluminum oxide; and
a metal gate layer;
and
a layer of aluminum formed on the side of the multilayer structure such that the layer of aluminum is in contact with at least the substrate, the first layer of aluminum antimonide, the layer of indium arsenide, the layer of gallium antimonide, and the second layer of aluminum antimonide, wherein the first portion and the second portion are divided by a gap that extends along the side of the multilayer structure in a direction between the bottom and the top of the multilayer structure.

17. The device of claim 16, wherein metal layer comprises at least one of titanium or gold.

18. The device of claim 16, wherein a combined thickness of the layer of indium arsenide and the layer of gallium antimonide is at least 10 nm.

19. The device of claim 16, wherein the gap separates the first portion from the second portion by a distance of between 100 nm and 1000 nm.

20. The device of claim 16, wherein the first layer of aluminum antimonide and the second layer of aluminum antimonide are each between 20 nm and 100 nm.

* * * * *